United States Patent
Adel et al.

(10) Patent No.: US 7,671,990 B1
(45) Date of Patent: Mar. 2, 2010

(54) CROSS HATCHED METROLOGY MARKS AND ASSOCIATED METHOD OF USE

(75) Inventors: Michael E. Adel, Zichron Ya'akov (IL); Vladimir Levinski, Nazareth Iilt (IL); Elyakim Kassel, Misgav (IL)

(73) Assignee: KLA-Tencor Technologies Corporation, Milpitas, CA (US)

( * ) Notice: Subject to any disclaimer, the term of this patent is extended or adjusted under 35 U.S.C. 154(b) by 177 days.

(21) Appl. No.: 11/759,183

(22) Filed: Jun. 6, 2007

Related U.S. Application Data (60) Provisional application No. 60/820,721, filed on Jul. 28, 2006.

(51) Int. Cl.
   *G01B 11/00* (2006.01)
(52) U.S. Cl. .................................................. 356/400
(58) Field of Classification Search ......... 356/399–401; 355/53, 55, 77; 382/151; 430/5, 22, 30; 257/797; 438/401
   See application file for complete search history.

(56) References Cited

U.S. PATENT DOCUMENTS

| | | | | |
|---|---|---|---|---|
| 4,664,524 A | * | 5/1987 | Hattori et al. | 356/401 |
| 4,760,265 A | * | 7/1988 | Yoshida et al. | 250/492.2 |
| 5,172,190 A | * | 12/1992 | Kaiser | 356/401 |
| 6,013,355 A | * | 1/2000 | Chen et al. | 428/209 |
| 6,921,916 B2 | | 7/2005 | Adel et al. | |
| 7,068,833 B1 | | 6/2006 | Ghinovker et al. | |
| 7,265,850 B2 | * | 9/2007 | Archie et al. | 356/625 |
| 2005/0012928 A1 | * | 1/2005 | Sezginer et al. | 356/401 |
| 2005/0157297 A1 | * | 7/2005 | Abdulhalim et al. | 356/401 |
| 2007/0031743 A1 | * | 2/2007 | Bijnen et al. | 430/22 |

OTHER PUBLICATIONS

Yi-Sha Ku et al., "In-chip overlay measurement by existing brightfield imaging optical tools", Proc. SPIE 5752, 438 (2005).
Tatsuo Fukui et al., "Overlay measurement tool up to 70-nm design rule".
Bernd Schulz et al., "In-chip overlay metrology in 90nm production", ISSM 2005.

* cited by examiner

*Primary Examiner*—Tarifur R. Chowdhury
*Assistant Examiner*—Isiaka O Akanbi
(74) *Attorney, Agent, or Firm*—Suiter Swantz pc llo (57) ABSTRACT

The present invention is directed to novel metrology marks and methods for their use. The marks comprise cross hashed overlay metrology marks formed on a substrate including a plurality of target regions. The mark including a first grating structure formed in one layer of a target region and including a second grating structure formed in another layer of the target region. The periodic features of the first and second grating structures are oriented substantially orthogonal one another to form a cross-hatched metrology target in the target region. Additionally, the patent discloses methods of employing the metrology marks to obtain overlay metrology measurements.

8 Claims, 7 Drawing Sheets

CROSS HATCHED METROLOGY MARKS AND ASSOCIATED METHOD OF USE

RELATED APPLICATIONS

The present application claims priority under 35 U.S.C. § 119(e) from U.S. Provisional Patent Application No. 60/820,721 entitled "CROSS HATCHED METROLOGY MARKS AND USE OF SAME" filed Jul. 28, 2006, the entire disclosure of which is incorporated herein by reference for all purposes.

FIELD OF THE INVENTION

The invention described herein relates generally to methods and processes for conducting overlay metrology measurements on target substrates. Some example substrates on semiconductor integrated circuit substrates.

BACKGROUND OF THE INVENTION

In the semiconductor industry it is common to obtain overlay metrology measurements of integrated circuit (IC) fabrication substrates during fabrication to insure that they are within the necessary alignments tolerances.

Such overlay metrology marks generally comprise features formed in two layers, the features configured to enable measurement of spatial displacement between features of the layers (i.e., the overlay or displacement between layers).

Many conventionally methods of conducting overlay measurements are known. And each serve well enough for their own purposes. However, certain improvements can be made.

Conventional overlay metrology marks generally comprise two features, one in each layer, which are positioned side by side or one inside the other. Examples of such approaches are outlined at many places in the art. The following references illustrate various examples of prior art approaches. One example is "In-chip overlay measurement by existing brightfield imaging optical tools" by Yi-Sha Ku, Chi-Hong Tung, and Nigel P. Smith, Proc. SPIE 5752, 438 (2005). Another example, is "Overlay measurement tool up to 70-nm design rule" by Tatsuo Fukui, Hiroshi Aoki, Takeshi Endo, and Tomoaki Yamada. Another is disclosed in "In-chip overlay metrology in 90 nm production" by Bermd Schulz, Rolf Seltmann, Joerg Paufler, Philippe Leray, Aviv Frommer, Pavel Izikson, Elyakim Kassel & Mike Adel, ISSM 2005.

These examples are merely illustrative of aspects of the prior art and are not in any way limiting to the invention as disclosed herein.

One common prior art implementation is the so-called "box-in-box" metrology mark which employs marks in two layers subject to imaging techniques and image processing to obtain direct measurement of offset between the features of each layer and a comparison of those measurements to an intended offset to determine if the layers in question are within an alignment specification. Such targets are quite large and are not easily adaptable to the constant need in the art of implementing smaller and smaller targets.

Figure 1:
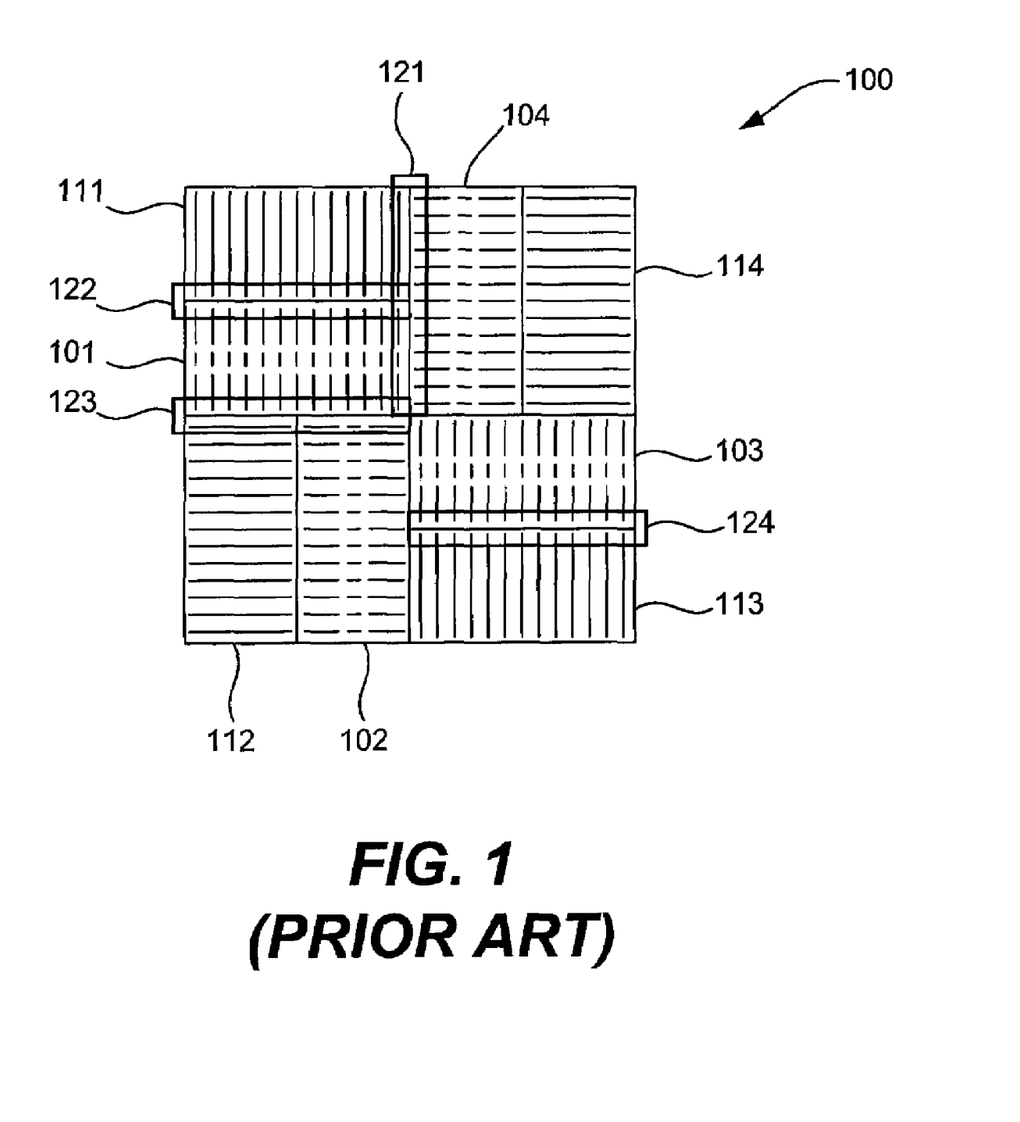
FIG. 1 is a simplified schematic depiction of a prior art "side-by-side" grating of a known AIM type target having "exclusion zones", the target used for imaging to obtain overlay metrology measurements.

Another overlay metrology imaging target 100 is a so-called side-by-side grating AIM type target. FIG. 1 provides a simplified illustration of one embodiment of such a target. A first set of gratings (schematically depicted by alternating dot-dashed lines) 101-104. Are formed in a first layer L1 of the target 100. A second set of gratings 111-114 is formed in a second layer L2 (schematically depicted bylines). Each grating in the first layer L1 is accompanied by a complementary target in the second layer L2 that is position to the side of the first target. Such pairs are arranged side by side so that each grating in L1 is parallel to an associated grating L2. Pairs 101/111, 102/112, 103/113, 104/114 each illustrate an example of such side-by-side pairs. These gratings are imaged and measurements of overlay are obtained (e.g., by comparing the displacement between adjacent side by side gratings such as 101 and 111). One problem inherent in the side-by-side imaging target 100 is that such targets are large, commonly being in the range of about 20 µm×20 µm to about 40 µm×40 µm in size. Moreover, because the gratings are adjacent to one another they very susceptible to cross talk from adjacent gratings. Thus, in order to prevent such crosstalk from degrading the resultant signal "exclusion zones" at the interfaces between adjacent gratings are used to prevent excessive illumination of adjacent grating structures. Illustratively, FIG. 1 depicts some examples of such exclusions zones. Exclusion zones 121, 122, 123, & 124 are depicted to illustrate some examples. The targets, of course, include still more exclusion zones. The inspector cannot illuminate the exclusion zone due to the risk of contaminating the signal. As a consequence, such targets not only suffer from large size and risk of contamination in the signal, but also suffer from the fact that large portions of the target (the exclusion zones) cannot be used to obtain metrology measurements. As briefly discussed, such targets have finite limits on how small they can be made (at least due to the need for the "exclusion zones") and have less than desirable suitability for being made smaller. Another shortcoming inherent in such side-by-side gratings like those in FIG. 1, is the problem of irregular contrast between target gratings. Because the targets are formed in different layers, each portion of the target and each layer of the target is subject to varying optical properties which makes contrast equalization between the various layers and gratings a daunting and difficult problem not easily overcome in the present art.

In addition to imaging metrology targets (such as those discussed above) so-called scatterometry overlay (SCOL) targets are employed to obtain overlay metrology measurements. Commonly, SCOL targets are employed as a targeting group with each target comprising a pair of two parallel gratings formed one over the other in different layers with a predetermined and deliberate offset between the gratings of the different layers. Additionally, the targeting groups include targets with gratings parallel to an "x" axis and other targets with gratings parallel to a "y" axis. Each target features a pair of gratings offset with respect to each other to enable accurate overlay metrology measurements. The intensity of a light scattering signal produced by illuminated targets can be used to determine overlay errors. Common examples of such intensity measurements are measurements of intensity at selected wavelengths or intensity measurements made at different scattering angles. In common implementations, such scatterometry targets are generally employed in target groups of eight or more adjacent targets. Thus, these SCOL targeting groups are quite large and also have many exclusion zones (e.g., in an eight target group ten exclusion zones can be present). Thus, such SCOL targets also suffer from finite size limitations and large exclusion zones that hinder there usage in ever smaller dimensions.

Thus, although existing targets and target measurement approaches are suitable for many implementations, the inventors suggest that many improvements can be made. The invention described herein discloses method and target apparatus for enabling improved metrology measurements.

SUMMARY OF THE INVENTION

The principles of the present invention disclose a method for fast bitmapping memory instances in a semiconductor IC die.

In one embodiment, the invention describes a cross hashed overlay metrology mark formed on a substrate the mark including a substrate including a plurality of target regions. The mark including a first grating structure formed in a first layer of a first target region of substrate and including a second grating structure formed in a second layer of the first target region. The mark configured so that periodic features of the second grating structure are oriented substantially orthogonal to periodic features of the first grating to form a cross-hatched metrology target in the first target region.

In another embodiment the invention describes a cross hashed overlay metrology mark for use in obtaining overlay metrology information during a semiconductor substrate inspection process. The mark includes a first layer comprising a plurality parallel periodic features arranged to form a first grating on a substrate and a second layer formed above the first layer. The second layer comprise a plurality parallel periodic features arranged to form a second grating configured so that the periodic features of the second grating are oriented substantially orthogonal to the parallel periodic features of the first grating.

In another embodiment the invention describes a cross hashed overlay metrology mark. The mark includes a first layer arranged in a plurality of target portions formed on a substrate. The first layer includes a first target portion comprising a plurality parallel periodic features arranged to form a first grating on the substrate and a second target portion comprising a plurality parallel periodic features arranged to form a second grating on the substrate. The periodic features of the first and second gratings are oriented substantially orthogonal to one another. The mark also includes a second layer arranged in a plurality of target portions that are positioned above the first layer. The second layer includes a third target portion having a plurality parallel periodic features arranged to form a third grating. Additionally, the third target portion is arranged above and in substantial registry with the first grating so that the periodic features of the third grating are oriented substantially orthogonally to the parallel periodic features of the first grating to form a first cross hatched target. The mark also includes a fourth target portion comprising a plurality parallel periodic features arranged to form a fourth grating, the fourth target portion arranged above and in substantial registry with the second portion of the first layer so that the periodic features of the fourth grating are oriented substantially orthogonally to the parallel periodic features of the second grating to form a second cross hatched target.

In another embodiment the invention describes a method for conducting overlay image metrology. The method includes providing a substrate having a cross-hashed metrology mark formed thereon and illuminating the cross-hashed metrology mark to produce imaging signal. The imaging signal is captured and processed to obtain overlay metrology information concerning the substrate. In another embodiment, the present invention comprises a computer implemented embodiment having computer implemented process instructions implementing the methodology and in yet another approach the invention contemplates an implementation where the instructions are carried over a carrier wave.

These and other features and advantages of the present invention are described below with reference to the drawings.

BRIEF DESCRIPTION OF THE DRAWINGS

The following detailed description will be more readily understood in conjunction with the accompanying drawings, in which.

It is to be understood that, in the drawings, like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In general terms the following discussion concerns methods and targeting approaches for conducting overlay metrology. Overlay metrology marks generally comprise features in two layers enabling overlay (i.e. displacement between layers) measurements to be measured. As previously indicated, conventional metrology marks have size limitations and limitation posed by the need for numerous exclusion zones. Additionally, the imaging implementations suffer from contrast equalization difficulties.

It is, however, advantageous to construct smaller metrology marks or targeting arrangements (also referred to in as targeting groups). In order to facilitate smaller targeting arrangements the targets (an associated target features) can be made smaller. Also, a reduction of the size of exclusion zones would be helpful.

The following discussion refers to specific embodiments of the invention. It is specifically noted that the invention is not limited to the disclosed embodiments but is intended to extend beyond the specific depicted embodiments. In general, embodiments of the invention include overlay metrology marks and associated target arrangements that include two (or more) grating layers arranged over one another in a cross hatched configuration and methods used to obtain overlay metrology information from the metrology marks.

In summary, the following is a description of specific implementations of novel overlay metrology marks. It is followed by a description of methods which can be used to extract overlay information from these kinds and other similar kinds of overlay metrology features.

Example embodiments are illustrated in the accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 2A:
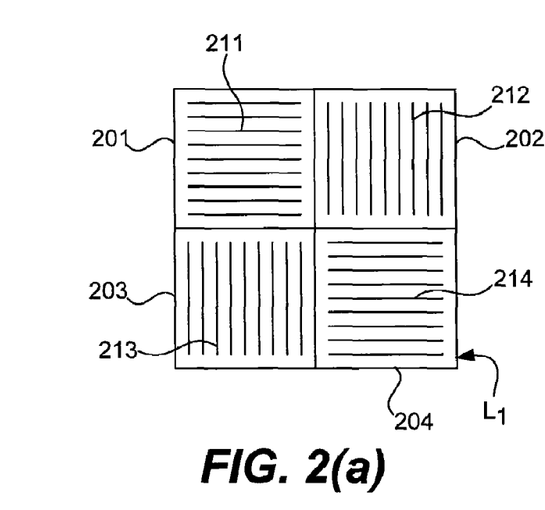
FIGS. 2(a)-2(d) are plan and section views of various aspects of a two layer embodiment of a cross hatched type metrology mark constructed in accordance with the principles of the invention.
Figure 2B:
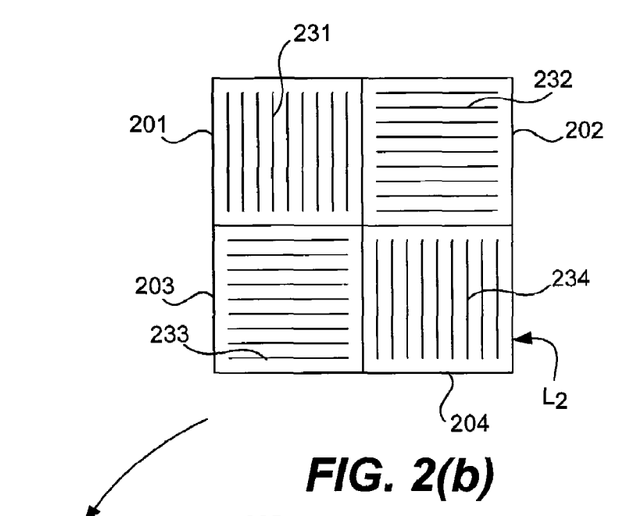
Figure 2C:
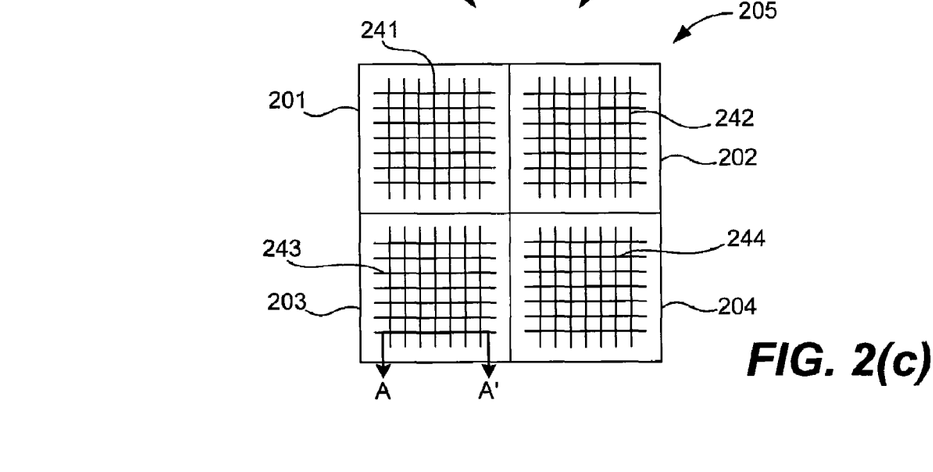

FIGS. 2(a)-2(d) are illustrations that depict aspects of an embodiment of the invention. A targeting arrangement in the depicted embodiment includes two layers of targeting features. FIGS. 2(a)-2(c) provide an abstract representation of the embodiments in which various attributes of the embodiment are rendered.

In FIG. 2(a) of the depicted embodiment a first layer L1 is depicted with four quadrants 201, 202, 203, 204. Each quadrant comprises a target region that is configured to include a plurality of repeating features arranged to form a diffraction grating. In some embodiments the pitch and line width of the repeating features of the gratings are regular. In some advantageous implementations, the line width of the features are the same or near the same as the line widths of structural features forming the device architectures formed on a wafer under inspection. Still referring to FIG. 2(a), the first layer L1 is configured so that the gratings of 211 (i.e., in quadrant 1 (201)) and of 214 (i.e., in quadrant 4 (204)) are oriented substantially parallel to each other but are also oriented substantially orthogonal to the gratings 212, 213 of associated quadrant 2 (202) and quadrant 3 (213).

Analogously, as depicted in FIG. 2(b), layer 2 L2 (which can be fabricated above or below layer 1 L1) is also configured with the same four quadrants 201, 202, 203, 204. The quadrants can be arranged either above or below a corresponding grating of layer 1 L1. Accordingly, quadrant 1 (201)) and quadrant 4 (204) gratings (231, 234 respectively) are oriented substantially orthogonal to quadrant 2 and 3 (202, 203) gratings (i.e., 232, 233). The patentee's point out that the gratings of layer 1 (L1) are each configured so that they are orthogonal to the gratings of layer 2 (L2). Accordingly, quadrant 1 (201) gratings 211, 231 are orthogonal to each other, quadrant 2 (202) gratings 212, 232 are also orthogonal to each other, the same can be said for the quadrant 3 (203) and 4 (204) gratings.

Thus, the two grating layers L1, L2 are overlaid one over the other to form the targeting arrangement 205 including four target regions (one in each quadrant) depicted in FIG. 2(c). Thus, in one example process, a portion of a periodic grating structure is printed on a first layer L1. Each layer of the grating structure includes portions with a grating vector parallel to one axis and another portion of the periodic grating structure printed in a substantially orthogonal direction in the same layer. For example, in L1 periodic gratings 211 and 214 are oriented orthogonally to periodic gratings 212 and 213. Thus, FIG. 2(c) depicts four quadrants 201, 202, 203, 204 each having a respective cross-hatched pattern of orthogonally oriented periodic grating patterns (241, 242, 243, 244).

In one embodiment, (e.g., as depicted in FIG. 2(c)) the metrology mark comprises four quadrants, where each quadrant can be though of as defining a target. That is, a first quadrant (target) contains a first periodic grating in a first layer positioned along one axis and a second quadrant contains a second periodic grating in the same layer positioned in a direction that is orthogonal to the first gratings. In the same first and second quadrants, second layer gratings are printed over and orthogonal to the first layer grating structures and these second layer gratings are also orthogonal to each other. These embodiments are shown in FIG. 1 below. The advantages of this mark over the standard AIM overlay mark are described below. An example of such a prior art AIM overlay mark is further described in U.S. Pat. No. 7,068,833 by Ghinovker et al. issued 27 Jun. 2006, which patent is incorporated herein by reference in its entirety.

Figure 2D:
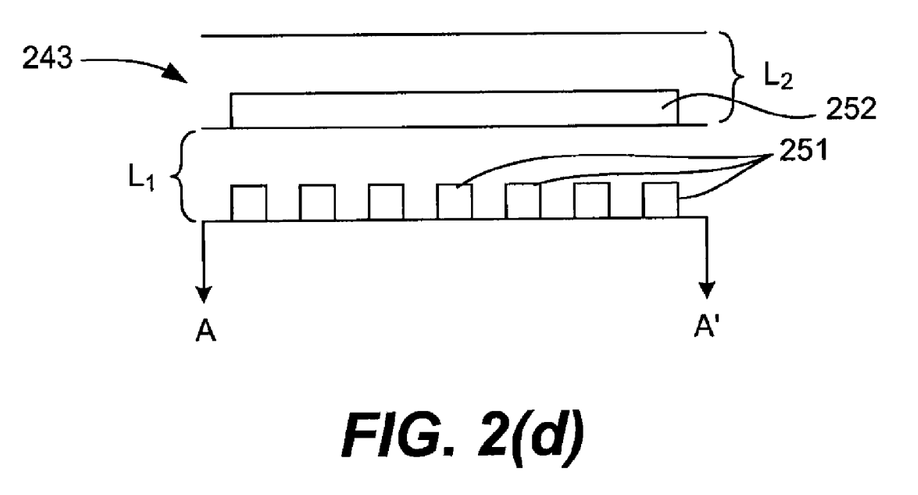

FIG. 2(d) illustrates a section view taken along axis A . . . A' from target 243 defined by quadrant 203 of FIG. 2(c). First layer L1 includes a grating 213 comprising a regular array of periodically spaced features 251 arranged having a predetermined line width and pitch. For example, the line width of the features can be set so that it has a line width of approximately the same dimensions of device features formed on the same layer. The second layer L2 includes another grating 233 comprising a regular array of periodically spaced features 252 arranged orthogonally to the periodically spaced features 251 of the first layer L1. The periodically spaced features 252 also having a predetermined line width and pitch. As such, FIG. 2(d) presents a cross-section view of a cross hatched target pattern in accordance with the principles of the invention. The layers can comprise many different materials used in semiconductor processing and are not limited to specific materials.

FIGS. 3(a)-3(d) illustrate other aspects of an embodiment of a targeting arrangement (metrology mark) employing three layers of periodic grating features arranged to enable a cross hatched targeting arrangements. This embodiment is shown depicted in three layers 301, 302, 303, which can be printed onto a substrate in any desired order to form a desired targeting arrangement.

Figure 3A:
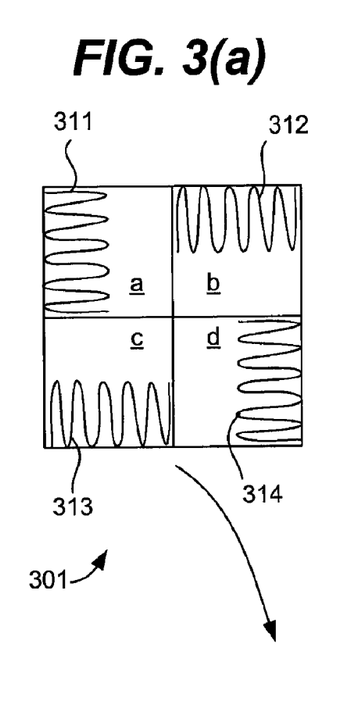
FIGS. 3(a)-3(d) are plan views of a three layer embodiment of a cross hatched metrology type mark constructed in accordance with the principles of the invention.

For example, in FIG. 3(a), a first layer 301 is configured in four quadrants a, b, c, d. Each quadrant is configured with a periodic grating arranged therein. For example, in a first layer 301 having a first quadrant a, a periodic grating 311 oriented in a first direction and covering about half of the quadrant is formed. A second quadrant b includes a periodic grating 312 oriented in a second direction orthogonal to the orientation of the first grating 311 and covering about half of the quadrant. A third quadrant c includes a periodic grating 313 having substantially the same orientation as the second grating 312 and occupying about half the quadrant and a fourth quadrant d including a fourth periodic grating 314 occupying about half the quadrant and having substantially the same orientation as the first grating 311.

In FIG. 3(a), second layer 302, four quadrants a, b, c, d can also be employed. Again, each quadrant is configured with a periodic grating. The second layer 302 also includes a first quadrant a configured with a periodic grating 321 oriented in a first direction (e.g., in the same direction as grating 311 of the first layer 301) and covering the other half of quadrant a.

Figure 3B:
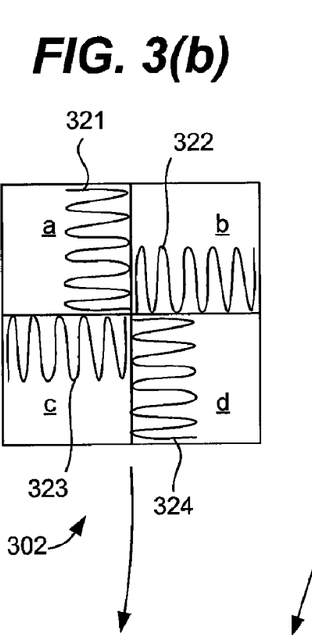

The second quadrant b of the second layer 302 includes another periodic grating 322 oriented in a direction substantially orthogonal grating 321 and covering about half of the quadrant. The second grating 322 of the second layer 302 is complementary to the second grating 312 of the first layer, thus, covering the other half of quadrant b.

A third quadrant c includes a periodic grating 323 having substantially the same orientation as the third grating 313 of the first layer 301 and occupying the other half of the quadrant as the third grating 313. Also, the fourth quadrant d includes a fourth periodic grating 324 of the second layer 302 occupying about half the quadrant and having substantially the same orientation as the associated forth grating 314 of the first layer 301.

Figure 3C:
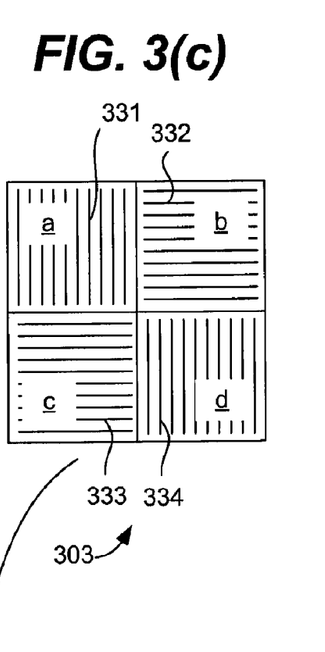

Additionally, FIG. 3(c) depicts a third layer 303 configured in the same four quadrants a, b, c, d. In this embodiment, each quadrant is configured with a single periodic grating arranged therein. Each grating of the third layer 303 is configured to be orthogonal to both of the underlying gratings of layers 301 and 302. For example, in the first quadrant a of 303, a periodic grating 331 oriented in a first direction covering substantially all of quadrant a. A substantially parallel grating pattern 334 is also formed in quadrant d. A second quadrant b includes a periodic grating 332 oriented in a second direction orthogonal to the orientation of the first and fourth gratings 331, 334. This grating 332 occupies substantially all of the quadrant b. The third quadrant c includes a periodic grating 333 having substantially the same orientation as the second grating 332 and occupying substantially all of quadrant c.

Figure 3D:
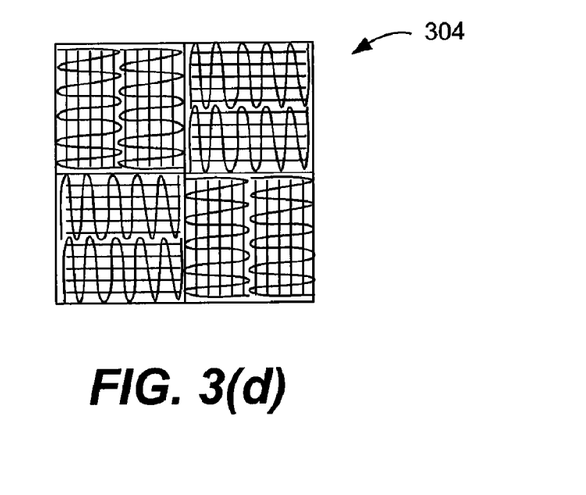

During fabrication layers 301, 302, 303 are formed. They are positioned, generally, one over another, and in substantial alignment with one another. Accordingly, such an arrangement can be used to form a three layer cross hatched targeting arrangement such as depicted in the plane view 304 of FIG. 3(d). Each of the depicted quadrants has a layer of orthogonally disposed periodic grating structures over substantially all of each quadrant. The plan view of the targeting arrangement 304 shows the cross hatched pattern of the three layer targeting arrangement. The patentees specifically point out that many different fabrication configurations can be used in accordance with the principles of the invention. Although the embodiment depicted in FIG. 3(d) includes a specific configuration many other can be used. For example, in FIG. 3(d), layer 301 (of FIG. 3(a)) is formed first. Then layer 302 (of FIG. 3(b)) can be formed next so that the quadrants of both layers 301, 302 are in substantial alignment. Thus, the 301, 302 layers comprise a portion of a targeting arrangement that includes two sets of parallel gratings in each quadrant (in the depicted example, portions of the parallel gratings are formed in different layers). A third layer 303 (shown in FIG. 3(c)) is formed over the previously formed other two layers 301, 302. Thus, the three layers 301, 302, 303, formed and aligned one over another configure a three layer cross-hatched targeting arrangement 304 such as is depicted in FIG. 3(d).

The patentees specifically point out that the specific order in which the layers (e.g., 301, 302, 303) are formed can be varied to obtain other embodiments of three layer cross-hatched target arrangements in accordance with the principles of the invention. Moreover, targeting arrangements configured to use more than the two and three layer implementations shown here are specifically contemplated by the inventors. Also, targeting arrangements having more than one target, and more than four targets (e.g., a, b, c, d), can be employed in accordance with the principles of the invention.

These targets can be interrogated using many different methods in accordance with the principles of the invention. In one implementation, a method of measurement of the cross-hatched target (or mark) may be substantially similar to the method of measurement of the standard AIM mark disclosed in U.S. Pat. No. 6,921,916 B2 by Michael Adel et al. issued 26 Jul. 7, 2005, which patent is incorporated herein by reference in its entirety.

Other methods may also be implemented. In a cross hatch case, kernel collapse on each quadrant may be performed along both x and y axes, enabling grating center of symmetry data to be extracted simultaneously from both layers, but in orthogonal directions.

The reader is urged to refer to the upper right quadrant (target region) of the targeting arrangement depicted in FIG. 2(c). In that embodiment, the L2 grating 232 is formed over the underlying L1 grating 212. An analogous quadrant (target region) includes target 401, which is depicted in FIG. 4(a) and shows an L1 grating 403 overlaid with an orthogonal L2 grating 402.

Figure 4:
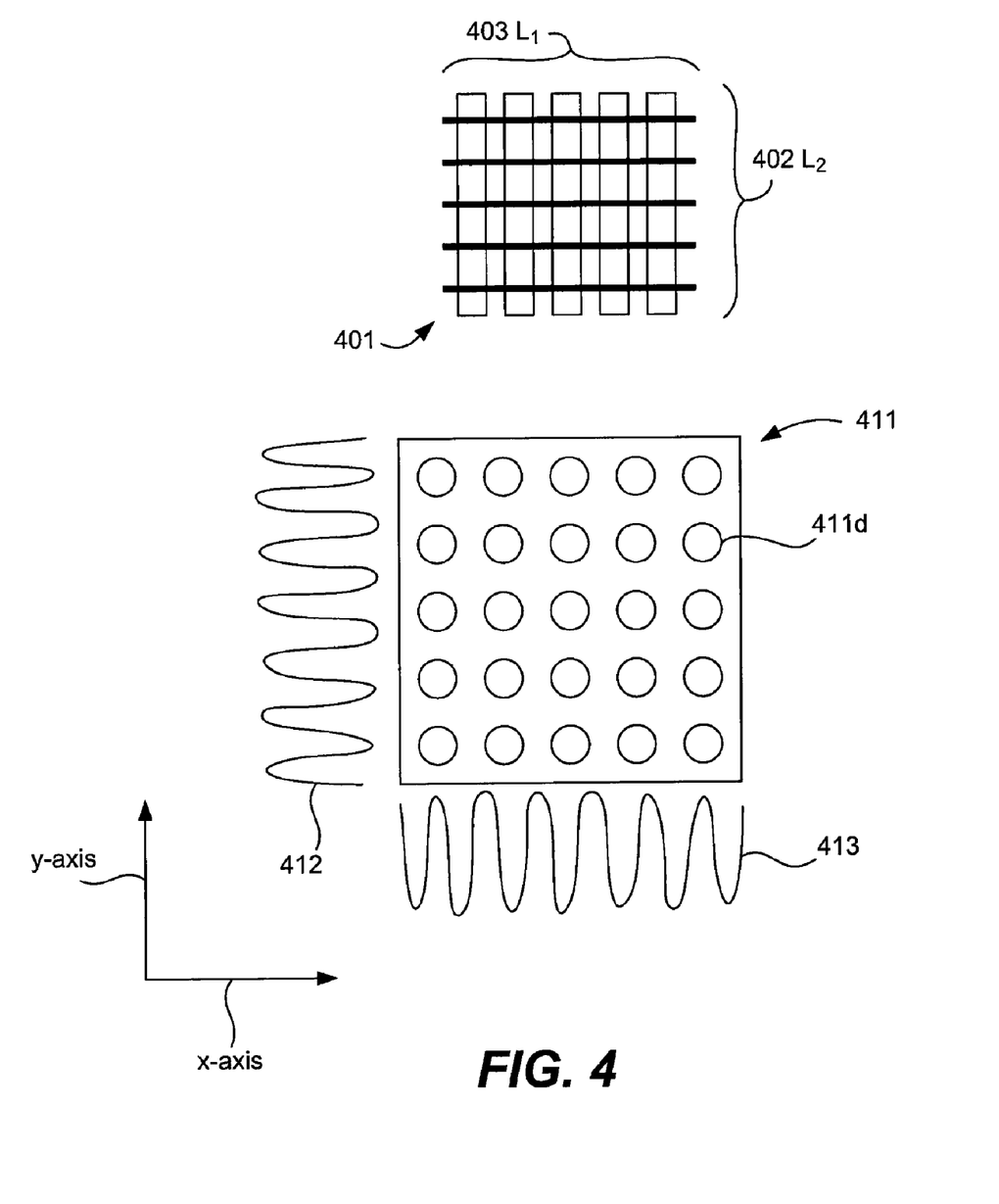
FIG. 4 is an abstracted depiction of a cross-hatched overlay metrology mark and an associated imaging signal produced by the mark with indications summarizing some aspects of signal processing used in accordance with the principles of the invention.

When illuminated (e.g., using flood illumination) the target 401 produces a signal that is illustrated by the dot pattern 411 of FIG. 4(b). Each of the dots 411d represent a spot of light received from the illuminated target. Projections of the illumination pattern produced by the target can be taken along either the x-axis or along the y-axis. By projections the patentees mean that the signal (shown in FIG. 4(b)) can be summed in along either the x-axis or the y-axis and can be used to define a center of symmetry (COS) for the target.

For example, projection 412 illustrates an example of a projection taken of the target 401 along the x-axis. This projection 412 is a summing of the light signals in the x-direction. This projection 412 is suitable for measuring the overlay displacement of the L2 grating (402) of target 401 in the y-direction. Additionally, another perpendicular projection 413 can be taken of the same image 411 along the y-axis. This projection 413 is suitable for measuring the overlay displacement of the L1 grating (403) of target 401 in the x direction.

A similar pattern and similar information can be obtained from the lower left target 203 of FIG. 2(c). If the same method is applied to the lower left target 203 projection 412 (summed signal in the x-direction) is also suitable for measuring the overlay displacement of the L2 grating (233) of target 203 in the y-direction. Analogously, perpendicular projection 413 taken of the same target 203 image along the y-axis is suitable for measuring the overlay displacement of the L1 grating (213) of target 203 in the x direction.

When applied to the upper right target 201 and to the lower left target 204 the method of using the projections obtains different overlay displacement information. For example, if the same method is applied to the upper right target 201 (of FIG. 2(a)) projection 412 (summed signal in the x-direction) is suitable for measuring the overlay displacement of the L1 grating (211) of target 201 in the y-direction. Analogously, the perpendicular projection 413 taken of the same target 201 image along the y-axis measures the overlay displacement of the L2 grating (231) of target 201 in the x direction. Moreover, when applied to the lower left target 204 (of FIG. 2(a)) projection 412 (summed signal in the x-direction) is again suitable for measuring the overlay displacement of the L1 grating (214) of target 204 in the y-direction. The perpendicular projection 413 taken of the same target 204 image along the y-axis measures the overlay displacement of the L2 grating (234) of target 204 in the x direction.

Accordingly, the depicted target design (e.g., as in FIG. 2(a)) enables projections of right-upper and left-lower quadrants on y-axis, which define the position of COS of upper layer in y direction, the bottom layer grating contributing only to the DC of the projected signal. The COS position of each layer of grating structures in the y direction may be compared to each other enabling the overlay in the y direction to be determined based on offset of the COS positions. At the same time, projections of right-upper and left-lower quadrants on x-axis define the position of center of symmetry of bottom layer in x direction while the upper layer grating contributes only to the DC. Likewise, the COS position of each layer of grating structures in the x direction may be compared to each other to thereby determine overlay in the x direction based on offset of the COS positions. By the same way, projections of the left-upper and right-lower quadrants define centers of symmetry of upper and lower layers in x and y directions, respectively.

Cross hatched overlay metrology marks (or targeting arrangements) constructed in accordance with the principles of the invention have particular advantages in terms of manufacturability. The patentees point out that since modern semiconductor processes are generally optimized for printing precisely such structures, e.g., dense periodic structures overlapping in orthogonal directions, the targeting structure described herein are well suited to fabrication in accordance with existing processes. Furthermore, this architecture obviates the need to leave any open space whatsoever in the first layer and this also improves process robustness and process compatibility.

Another particular advantage obtained through the use of the cross hatched overlay marks is that they can be made very small. For example, when referring to FIGS. 2(d) or 3(c) the depicted targets are generally in the range of 20 μm×20 μm and commonly less than 8 μm×8 μm. In fact, in accordance with the principles of the invention targets sized as small as 6 μm×6 μm can be formed. Due to the necessity in the prior art of large exclusion zones (and other reasons) such target sizes are not possible in the current art. This is especially the case with targets smaller than 8 μm×8 μm. This can be important when faced with spaced limitation and the need for high information content. The presently disclosed targets enable smaller metrology mark sizes and maximize information content. This enables a number of advantages over the prior art. Firstly, it doubles the effective information density since a given quadrant now contains overlay information applicable to both X and Y overlay. Secondly, the area available for overlay information extraction is increased by reducing the number of boundaries between working zones. As a result, the area of exclusion zones not available for overlay computation due to optical cross talk is substantially reduced in the targeting arrangements disclosed herein. As mentioned above, exclusion zones are areas of the target image where either a physical target structure or a corresponding optical signal produces distorted information. Accordingly, such areas are excluded from the overlay calculation. Such exclusion zones commonly occur at working zone boundaries. In most cases, the working zones (e.g., different grating areas) are spatially separated from one another so that they do not overlap portions of an adjacent working zone (i.e., each of the working zones represents a different area of the mark). This is typically done to ensure that each of the working zones is properly imaged by the metrology tool. Although not always necessary, the working zones may be spatially separated by an exclusion zone so that each of the working zones is distinct. The design of the present target embodiments reduce the number of such exclusion zones. This disclosure provides methods for accomplishing this goal.

Another advantage in the use of the cross-hatched targets of the present invention is that the cross-hatched targets do not suffer as severely from the problem of contrast equalization as do the prior art side-by-side type targeting arrangements. This is because imaging of the inventive cross-hatched marks is conducted by imaging through all layers of the target substrate (i.e., all targets have periodic features on all layers, e.g., L1 and L2 and so on). In contrast, side-by-side type targeting arrangements do not generally include target features on each level. Commonly the side-by-side type targeting arrangements have adjacent periodic features formed on different layers and therefore such features are imaged with differing levels of contrast. This is an imaging problem that results in reduced accuracy. Embodiments of the present invention do not suffer from this problem.

Figure 5:
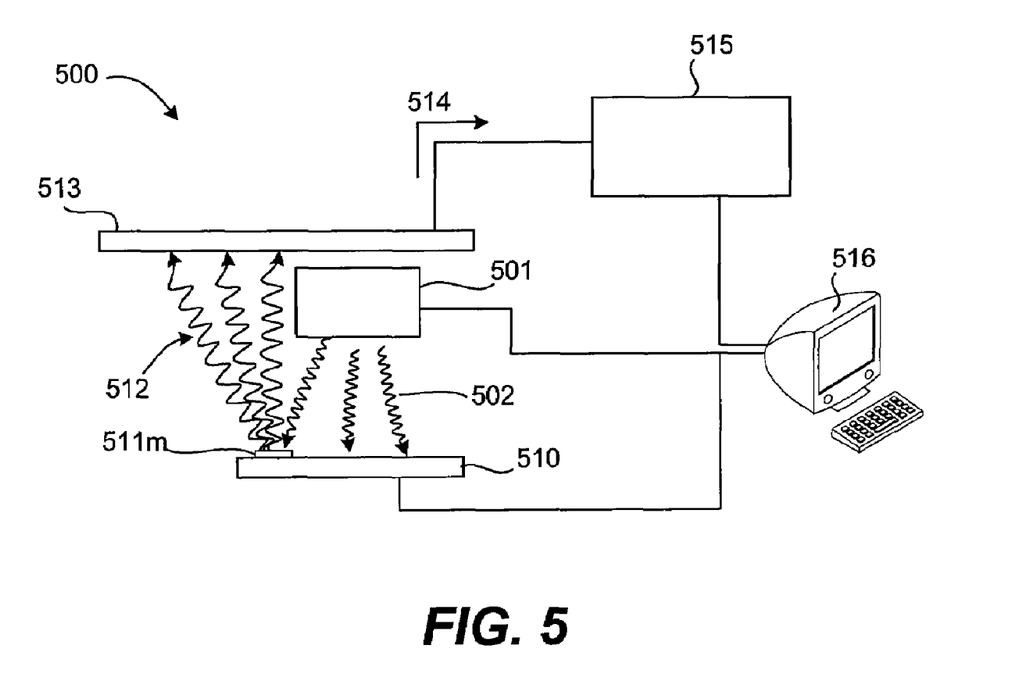
FIG. 5 is a simplified schematic depiction of a system for capturing metrology imaging information from a cross-hatched metrology mark in accordance with the principles of the invention.

One embodiment of a machine suitable for implementing aspects of the invention is depicted, in simplified form, in FIG. 5. FIG. 5 schematically depicts a very simplified description of an imaging inspection system 500 suitable for use in conjunction with the overlay metrology marks disclosed herein. In the depicted embodiment, an illumination source 501 produces an illumination beam 502 that is directed onto a subject wafer 510 (or other substrate). This illumination 502 illuminates a cross-hatched metrology mark scatterometry target 511m of the present invention. The illumination beam 502 impinging upon the mark 511m is produces an imaging signal 512. This signal 512 is captured by a light detection apparatus 513 sensitive to and collects the imaging signal 512. The light detection apparatus 513 converts the imaging signal 512 into an electrical signal 514 that is capable of being processed by a processor (e.g., a microprocessor, computer, or other suitably capable electronic device) 515 to obtain useful information concerning the cross-hatches marks formed on the substrate. One such example is the projection method described above. Other signal evaluation techniques can also be used. In one example, a suitable inspection tool comprises, but is not limited to, a tool like the CRS 1010 inspection tool produced by KLA-Tencor Corporation of San Jose, Calif.

The inventor points out that the entire depicted apparatus 100 can be controlled by a computer system 516. Such a computer system 516 can operate as a stand-alone computer system or part of the network. Additionally, the system 500 of the present invention can operate in conjunction with a distributed computer system having many computers. These computer systems can take many physical forms ranging from an integrated circuit, a printed circuit board, and a small handheld device up to a huge super computer. Additionally, computer systems are intended to apply to networked computer systems having many individual computers. Such networked systems can include local area networks (LAN's) or a wide area network (WAN's). An example of a LAN is a private network used by a mid-sized company with a building complex. Publicly accessible WAN's include, but are not limited to, the Internet, cellular telephone network, satellite systems and plain-old-telephone systems (POTS). Examples of private WAN's include those used by multi-national corporations for their internal information system needs. The network may also be a combination of private and/or public LANs and/or WANs. Such computer systems can be used to input data and otherwise control the system 500 implemented here.

Figure 6:
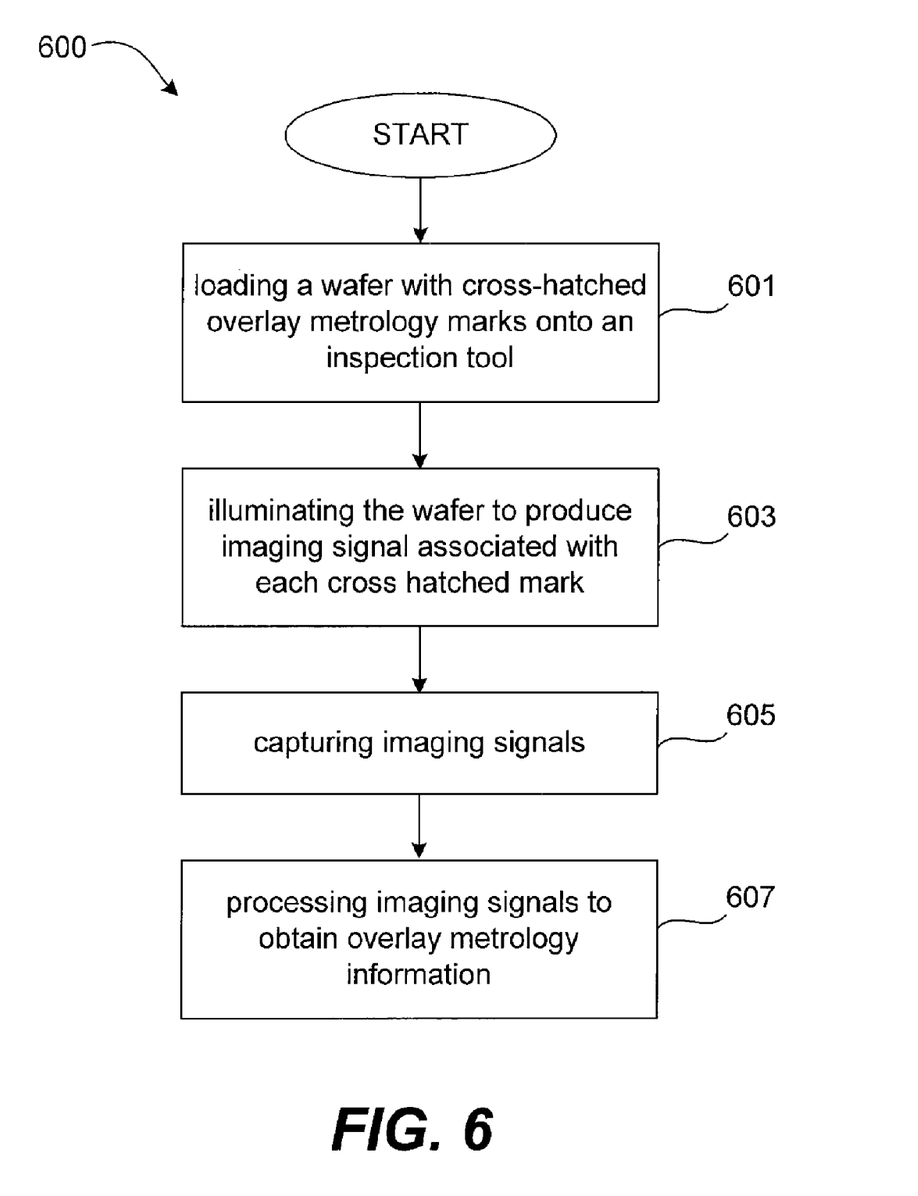
FIG. 6 is a simplified flow diagram illustrating a process flow usable by embodiments of the present invention.

In one simplified implementation the invention can be implemented as follows. Reference is made to FIG. 6. A wafer having a plurality of the inventive cross-hatched metrology marks is loaded onto a suitable metrology tool for inspection (Step 601). The substrate and particularly the cross-hashed metrology marks are illuminated with each inspected mark producing an associated imaging signal (Step 603). Each imaging signal is captured (detected) to provide overlay metrology data concerning each metrology mark (Step 605). The captured imaging signals are then processed to obtain overlay metrology information concerning the substrate (Step 607). Further processing and analysis are conducted as desired or necessary to determine if the wafer overlay error is within acceptable parameters.

The techniques of the present invention may be implemented in any suitable combination of software and/or hardware system. Regardless of the system's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store layout patterns, layout constraint rules and target rules.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave traveling over an appropriate medium such as airwaves, optical lines, electric lines, vacuum, etc. Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive.

The present invention has been particularly shown and described with respect to certain embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Further, reference in the claims to an element in the singular is not intended to mean "one and only one" unless explicitly stated, but rather, "one or more".

What is claimed is:

1. A cross hashed overlay metrology mark for use in obtaining overlay metrology information during a semiconductor substrate inspection process, the mark comprising:
    a substrate including a plurality of target regions;
    a first grating structure formed in a first layer of a first target region of the plurality of target regions where the first layer includes
        a first target portion comprising a plurality parallel periodic features arranged to form a first grating on the substrate;
        a second target portion comprising a plurality parallel periodic features arranged to form a second grating on the substrate, wherein the periodic features of the second grating are oriented substantially orthogonal to the parallel periodic features of the first grating;
        a fifth target portion comprising a plurality parallel periodic features arranged to form a fifth grating on the substrate; and
        a sixth second target portion comprising a plurality parallel periodic features arranged to form a sixth grating on the substrate; and
    a second grating structure formed in a second layer of the first target region wherein periodic features of the second grating structure are oriented substantially orthogonal to periodic features of the first grating to form a cross-hatched metrology target in the first target region, where the second layer includes
        a third target portion comprising a plurality parallel periodic features arranged to form a third grating, the third target portion arranged above and in substantial registry with the first grating and arranged so that the periodic features of the third grating are oriented substantially orthogonally to the parallel periodic features of the first grating to form a first cross hatched target;
        a fourth target portion comprising a plurality parallel periodic features arranged to form a fourth grating, the fourth target portion arranged above and in substantial registry with the second portion of the first layer so that the periodic features of the fourth grating are oriented substantially orthogonally to the parallel periodic features of the second grating to form a second cross hatched target;
        a seventh target portion comprising a plurality parallel periodic features arranged to form a seventh grating that is arranged above and in substantial registry with the fifth grating so that the periodic features of the fifth grating are oriented substantially orthogonally to the periodic features of the seventh grating to form a third cross hatched target; and
        an eighth target portion comprising a plurality parallel periodic features arranged to form an eighth grating that is arranged above and in substantial registry with the sixth grating so that the periodic features of the eighth grating are oriented substantially orthogonally to the parallel periodic features of the sixth grating to form a fourth cross hatched target,
    wherein the targeting arrangement is configured in four quadrants, where each of the first, second, third, and fourth cross hatched targets are formed in associated first, second, third, and fourth quadrants of the targeting arrangement.

2. The cross hashed overlay metrology mark as recited in claim 1 further comprising:
    a third grating structure formed in a third layer of the first target region, the third grating structure configured so that periodic features of the third grating structure are oriented parallel to the periodic features of the first grating structure; and oriented substantially orthogonal to periodic features of the second grating to form the cross-hatched metrology target.

3. The cross hashed overlay metrology mark as recited in claim 1 wherein the first layer is formed above the second layer.

4. The cross hashed overlay metrology mark as recited in claim 1 wherein the plurality of target regions each include a cross-hatched metrology target.

5. A method for conducting overlay image metrology, the method comprising:
    providing a substrate having a cross-hashed metrology mark formed thereon, where the cross-hashed metrology mark includes
        a first grating structure formed in a first layer of a first target region of the plurality of target regions where the first layer includes a first target portion comprising a plurality parallel periodic features arranged to form a first grating on the substrate;

a second target portion comprising a plurality parallel periodic features arranged to form a second grating on the substrate, wherein the periodic features of the second grating are oriented substantially orthogonal to the parallel periodic features of the first grating;

a fifth target portion comprising a plurality parallel periodic features arranged to form a fifth grating on the substrate; and a sixth second target portion comprising a plurality parallel periodic features arranged to form a sixth grating on the substrate; and a second grating structure formed in a second layer of the first target region wherein periodic features of the second grating structure are oriented substantially orthogonal to periodic features of the first grating to form a cross-hatched metrology target in the first target region, where the second layer includes a third target portion comprising a plurality parallel periodic features arranged to form a third grating, the third target portion arranged above and in substantial registry with the first grating and arranged so that the periodic features of the third grating are oriented substantially orthogonally to the parallel periodic features of the first grating to form a first cross hatched target;

a fourth target portion comprising a plurality parallel periodic features arranged to form a fourth grating, the fourth target portion arranged above and in substantial registry with the second portion of the first layer so that the periodic features of the fourth grating are oriented substantially orthogonally to the parallel periodic features of the second grating to form a second cross hatched target;

a seventh target portion comprising a plurality parallel periodic features arranged to form a seventh grating that is arranged above and in substantial registry with the fifth grating so that the periodic features of the fifth grating are oriented substantially orthogonally to the periodic features of the seventh grating to form a third cross hatched target; and an eighth target portion comprising a plurality parallel periodic features arranged to form an eighth grating that is arranged above and in substantial registry with the sixth grating so that the periodic features of the eighth grating are oriented substantially orthogonally to the parallel periodic features of the sixth grating to form a fourth cross hatched target, wherein the targeting arrangement is configured in four quadrants, where each of the first, second, third, and fourth cross hatched targets are formed in associated first, second, third, and fourth quadrants of the targeting arrangement;

illuminating the cross-hashed metrology mark to produce imaging signal; capturing the imaging signal; and processing the imaging signal to obtain overlay metrology information concerning the substrate.

6. The method of claim 5 wherein processing the imaging signal comprises taking a projection of the imaging signal along at least one axis to determine overlay offset.

7. The method of claim 5 wherein processing the imaging signal comprises taking a projection of the imaging signal along two perpendicular axes to determine overlay offset in two perpendicular directions.

8. A computer program product embodied on a computer readable media including computer program code for enabling overlay image metrology, the program product including:

computer program code instructions for enabling the execution of illumination of a cross-hashed metrology mark formed on a substrate to produce an imaging signal containing overlay metrology information where the cross-hashed metrology mark includes a first grating structure formed in a first layer of a first target region of the plurality of target regions where the first layer includes a first target portion comprising a plurality parallel periodic features arranged to form a first grating on the substrate;

a second target portion comprising a plurality parallel periodic features arranged to form a second grating on the substrate, wherein the periodic features of the second grating are oriented substantially orthogonal to the parallel periodic features of the first grating;

a fifth target portion comprising a plurality parallel periodic features arranged to form a fifth grating on the substrate; and a sixth second target portion comprising a plurality parallel periodic features arranged to form a sixth grating on the substrate; and a second grating structure formed in a second layer of the first target region wherein periodic features of the second grating structure are oriented substantially orthogonal to periodic features of the first grating to form a cross-hatched metrology target in the first target region, where the second layer includes a third target portion comprising a plurality parallel periodic features arranged to form a third grating, the third target portion arranged above and in substantial registry with the first grating and arranged so that the periodic features of the third grating are oriented substantially orthogonally to the parallel periodic features of the first grating to form a first cross hatched target;

a fourth target portion comprising a plurality parallel periodic features arranged to form a fourth grating, the fourth target portion arranged above and in substantial registry with the second portion of the first layer so that the periodic features of the fourth grating are oriented substantially orthogonally to the parallel periodic features of the second grating to form a second cross hatched target;

a seventh target portion comprising a plurality parallel periodic features arranged to form a seventh grating that is arranged above and in substantial registry with the fifth grating so that the periodic features of the fifth grating are oriented substantially orthogonally to the periodic features of the seventh grating to form a third cross hatched target; and an eighth target portion comprising a plurality parallel periodic features arranged to form an eighth grating that is arranged above and in substantial registry with the sixth grating so that the periodic features of the eighth grating are oriented substantially orthogonally to the parallel periodic features of the sixth grating to form a fourth cross hatched target, wherein the targeting arrangement is configured in four quadrants, where each of the first, second, third, and fourth cross hatched targets are formed in associated first, second, third, and fourth quadrants of the targeting arrangement;

computer program code instructions for enabling the capture of an imaging signal produced by the illuminated metrology mark;

computer program code instructions for processing the imaging signal to obtain overlay metrology information concerning the substrate.

* * * * *